(12) United States Patent
Sill et al.

(10) Patent No.: US 6,577,113 B2
(45) Date of Patent: Jun. 10, 2003

(54) APPARATUS AND METHOD FOR MEASURING SUBSTRATE BIASING DURING PLASMA PROCESSING OF A SUBSTRATE

(75) Inventors: Edward L. Sill, Escondido, CA (US); William D. Jones, Phoenix, AZ (US); Craig T. Baldwin, Chandler, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/875,341

(22) Filed: Jun. 6, 2001

(65) Prior Publication Data

US 2002/0186018 A1 Dec. 12, 2002

(51) Int. Cl.$^7$ ............................................... G01R 31/02
(52) U.S. Cl. ................................................... 324/72.5
(58) Field of Search ........................ 324/463, 72, 72.5, 324/661; 361/234; 118/728; 156/345.51

(56) References Cited

U.S. PATENT DOCUMENTS

| | | | | |
|---|---|---|---|---|
| 4,036,723 A | * | 7/1977 | Schwartz et al. | 204/192.15 |
| 5,117,121 A | | 5/1992 | Watanabe et al. | 307/130 |
| 5,164,319 A | * | 11/1992 | Hafeman et al. | 204/400 |
| 5,376,213 A | | 12/1994 | Ueda et al. | 156/345 |
| 5,384,570 A | * | 1/1995 | Dedic | 341/155 |
| 5,567,267 A | | 10/1996 | Kazama et al. | 156/345 |
| 5,591,269 A | | 1/1997 | Arami et al. | 118/723 |
| 5,708,556 A | | 1/1998 | van Os et al. | 361/234 |
| 5,737,175 A | | 4/1998 | Grosshart et al. | 361/234 |
| 5,820,723 A | | 10/1998 | Benjamin et al. | 156/345 |
| 5,835,334 A | | 11/1998 | McMillin et al. | 361/234 |
| 5,880,924 A | | 3/1999 | Kumar et al. | 361/234 |
| 5,886,866 A | | 3/1999 | Hausmann | 361/234 |
| 6,074,488 A | | 6/2000 | Roderick et al. | 118/728 |
| 6,108,189 A | | 8/2000 | Weldon et al. | 361/234 |
| 6,120,661 A | | 9/2000 | Hirano et al. | 204/298 |
| 6,136,211 A | | 10/2000 | Qian et al. | 216/37 |
| 6,253,704 B1 | * | 7/2001 | Savas | 118/723 |

FOREIGN PATENT DOCUMENTS

| EP | 0819780 A2 | 1/1998 |
|---|---|---|
| EP | 0819780 A3 | 5/1998 |

OTHER PUBLICATIONS

Berry et al., *Control of the Radio–Frequency Wave Form at the Chuck of an Industrial Oxide–Etch Reactor*, J. Vac. Sci. Technol. A 18(6) Nov./Dec. 2000, p. 2806–14.

Hongching Shan et al., *Process Kit and Wafer Temperature Effects on Dielectric Etch Rate and Uniformity of Electrostatic Chuck*, J. Vac. Sci. Technol. B14(1) Jan./Feb. 1996, pp. 521–526.

* cited by examiner

Primary Examiner—N. Le
Assistant Examiner—John Teresinski
(74) Attorney, Agent, or Firm—Wood, Herron & Evans, LLP

(57) ABSTRACT

A processing system for processing a substrate with a plasma comprises a processing chamber configured for containing a plasma and a substrate support. Electrodes are coupled to the substrate support and an RF power source is coupled to each of the electrodes for biasing the electrodes to create a DC bias on a substrate positioned on the supporting surface. Multiple voltage measurement circuits are electrically coupled to the RF power source and the electrodes to measure voltages at multiple points. A precursor determines the DC bias levels of the electrodes based on the multiple measurement points.

18 Claims, 3 Drawing Sheets

APPARATUS AND METHOD FOR MEASURING SUBSTRATE BIASING DURING PLASMA PROCESSING OF A SUBSTRATE

FIELD OF THE INVENTION

This invention relates generally to the processing of a substrate utilizing a plasma in the production of integrated circuits, and specifically relates to the determination of substrate RF bias parameters in a plasma processing system, such as one utilizing an electrostatic chuck to secure a substrate to a susceptor during processing.

BACKGROUND OF THE INVENTION

Gas plasmas are widely used in a variety of integrated circuit fabrication processes, including plasma etching and plasma deposition applications, such as PECVD. Generally, plasmas are produced within a processing chamber by introducing a low-pressure process gas into the chamber and then directing electrical energy into the chamber for creating an electric field therein. The electric field creates an electron flow within the chamber which ionizes individual gas molecules by transferring kinetic energy to the molecules through individual electron-gas molecule collisions. The electrons are accelerated within the electric field, producing efficient ionization of the gas molecules. The ionized particles of the gas and the free electrons collectively form what is referred to as a gas plasma or discharge.

Gas plasmas are useful in a variety of different processes for forming integrated circuits. One commonly used plasma process is a plasma etch process wherein a layer of material is removed or "etched" from a surface of a substrate. In an etch process, the ionized gas particles of the plasma are generally positively charged, and the substrate is negatively biased such that the positively ionized plasma particles are attracted to the substrate surface to bombard the surface and thereby etch the substrate surface. For example, a substrate might be etched to remove an undesirable material layer or coating on the substrate before another layer is deposited. Such a pre-deposition etch process is often referred to as etch cleaning of the substrate.

Other common plasma processes involve deposition, wherein a material layer is deposited upon the substrate. Chemical vapor deposition, or CVD, for example, generally involves the introduction of material gases into a processing chamber wherein the gases chemically interact and form a material layer or coating on the exposed substrate surface. A gas plasma can be utilized to enhance the chemical interaction and the process. Consequently, such a CVD deposition process utilizing a plasma is referred to as plasma-enhanced CVD or PECVD. The plasma is utilized to provide energy to the process and enhance the deposition quality and/or deposition rate. Other plasma deposition processes also exist as are commonly understood by a person of ordinary skill in the art.

During plasma processing of a semiconductor substrate, it is often useful to apply an accelerating voltage to the surface of the substrate. The accelerating voltage or substrate bias is utilized to accelerate ions or other charged particles within the plasma to the substrate surface. In an etch process, the charged plasma particles are attracted to the substrate surface to actually bombard the surface and provide the etch as discussed above. In a deposition process, such as PECVD, the energy provided by such charged particle bombardment may be utilized to further enhance the deposition rate or to enhance the deposition quality of the material layer which is being deposited.

Generally, biasing of the substrate in plasma-enhanced etch and deposition processes is accomplished by capacitively coupling an RF field from RF biased electrodes in the processing chamber, through the substrate, and to the exposed substrate surface which is to be etched, or which is to receive a deposited material layer. Specifically, the electrodes, which are positioned within a susceptor or substrate support, are biased with an RF power supply to create an RF field. The RF field is then capacitively coupled through the susceptor and substrate to create a relatively uniform DC bias potential across the upper exposed substrate surface. The substrate surface DC bias, in turn, affects the plasma, as discussed above, to enhance the etch or deposition process.

Within a plasma processing system, the plasma will usually have particular non-uniformities associated therewith. For example, the plasma density is often greatest in the center of the plasma, due to edge effects proximate the sides of the processing chamber. The non-uniformities in the plasma may translate to discrepancies within the etch and deposition processes in which the plasma is utilized. For example, an undesirable variation in etch rate may occur wherein the etch rate proximate the center of the substrate is greater than the etch rate proximate the outer edges of the substrate. Furthermore, within a plasma-enhanced deposition process, the deposition may be affected proximate the center of the substrate differently than at the edge of the substrate thus creating a non-uniform deposition layer and a non-uniform deposition rate radially across the substrate.

Attempts have been made in the art to address such plasma non-uniformities in a plasma processing system. For example, U.S. Patent Application entitled "Improved Apparatus and Method for Plasma Processing of a Substrate Utilizing an Electrostatic Chuck," U.S. Ser. No. 09/565,606, filed May 4, 2000, discloses a plasma processing system which selectively adjusts the bias on the substrate to offset plasma non-uniformities in the system; that application is incorporated herein by reference in its entirety. While that system improves the overall plasma process, it has been difficult to achieve precise selectivity in varying the substrate bias. Therefore, it is an objective of the present invention to provide more precise adjustments to the substrate bias in a plasma processing system for addressing non-uniformities and other vagaries in the plasma.

In accordance with another aspect of the invention, it is desirable to provide precise bias control even in a system utilizing an electrostatic chuck. Particularly during integrated circuit fabrication, the substrate being processed is supported within the processing chamber by a substrate support or susceptor. Oftentimes, the substrate is physically secured on the susceptor during processing, such as to improve heat transfer between the substrate and susceptor. One way of securing a substrate involves the use of an electrostatic chuck (ESC), which uses an applied DC bias to the substrate to electrostatically attract and secure the substrate to the susceptor. Electrostatic chucks are known in the art with suitable designs being shown in U.S. Patent Application entitled "Improved Apparatus and Method for Plasma Processing of a Substrate Utilizing an Electrostatic Chuck," U.S. Ser. No. 09/565,606, filed May 4, 2000, noted above, and in U.S. Pat. No. 5,117,121, which patent is also incorporated herein by reference. Electrostatic chucks will usually use the same electrodes as are used to bias the substrate. This practice has made precise measurement of the substrate surface bias levels even more difficult due to the effect of the electrostatic clamping voltage on such measurement. Therefore, it is a further objective of the invention to provide more precise biasing of a substrate to address plasma non-uniformities within a processing system utilizing an electrostatic chuck.

Systems have been proposed for measuring substrate bias surface levels for an RF induced DC bias on a substrate. One such system is the subject of a U.S. Patent Application entitled, "Improved Apparatus and Method for Monitoring Substrate Biasing During Plasma Processing of a Substrate, U.S. Ser. No. 09/580,824 and filed on May 26, 2000, which application is incorporated herein by reference. While that application discloses an apparatus and methodology for measuring the substrate bias, it is affected by the level of DC current that is available to the measuring circuit. Particularly, suitable DC current levels may not be available for proper measurements.

The dielectric material utilized between the RF electrodes of a susceptor and the substrate traditionally has a very high resistivity. Such high resistivity results in a low available DC current at the susceptor, and therefore, makes use of an amplification circuit necessary for RF bias measurements, as set forth in the above-referenced application. For example, the resistivity of dielectric components of the susceptor may represent resistances in the range of tens of MegaOhms. Such low DC current issues and measurement difficulties must be addressed on susceptors or substrate supports which utilize mechanical clamping structures to hold the wafer thereon, as well as susceptors which utilize electrostatic clamps. Therefore, it is an objective of the invention to provide for measurement of the RF-induced DC bias on a substrate, in order that the bias may be selectively adjusted for desirable processing results.

It is still another objective of this invention to address the above-discussed objectives without adversely affecting the desired biasing of the substrate surface which is necessary for plasma processing.

These objectives and other objectives will become more readily apparent from the further description of the invention below.

SUMMARY OF THE INVENTION

The present invention provides for accurate measurement of the RF-induced DC bias on the electrodes of a substrate support so that the DC bias may be selectively adjusted to obtain the desirable effect on the plasma within the processing system. To that end, a plurality of electrodes are coupled to a substrate support, such as by being embedded in the substrate support. The electrodes are each positioned proximate the supporting surface of the substrate support and are electrically isolated from one another. For example, the electrodes might be surrounded by a dielectric material. Alternatively, the entire substrate support might be made of a dielectric material and the electrodes might be embedded therein. An RF power source is coupled to each of the electrodes across a respective splitting capacitor for biasing the electrodes. The biased electrodes thereby develop an RF-induced DC bias thereon, and are operable for creating a DC bias on a substrate which is positioned on the supporting surface of the substrate support.

In accordance with one aspect of the present invention, a measurement circuit is utilized which includes a voltage measurement circuit electrically coupled to each of the electrodes at a point between that electrode and its respective splitting capacitor. The voltage measurement circuit is operable for measuring a voltage at the point, which voltage is associated with the electrode, and each electrode includes such a voltage measurement circuit. Another voltage measurement circuit is electrically coupled to the RF power source and is operable for measuring the voltage which is provided for the electrodes by the RF power source.

Based upon the difference between the power source measurement and the measurements across each splitting capacitor for an electrode, a voltage drop may be determined across each splitting capacitor. Reflective of that voltage drop, the DC bias associated with each of the electrodes is determined. The measurement circuit utilized for obtaining the voltage measurements may incorporate a processor for utilizing the measured values and determining the DC bias associated with the various electrodes.

More specifically, the present invention incorporates an inventive measurement circuit model of the processing system wherein the circuit model is configured in accordance with the principles of the invention to reflect the electrical characteristics of the various components or sub-systems of the overall processing system. Based upon the presumed and known electrical characteristics of those sub-systems, voltage drops across each of the sub-systems may be determined based upon the measured voltage values. For example, the inventive circuit model incorporates a circuit leg for each of the electrodes. The RF current through each leg is then determined based upon the voltage measurements. The present invention utilizes the electrical characteristics for each component or sub-system, in combination with the determined RF current, in order to establish a voltage drop associated with each component or sub-system. The presumed electrical characteristics and known electrical characteristics are utilized to determine the voltage drop across the plasma sheath associated with each of the electrodes, and therefore, to determine the bias voltage associated with each of the electrodes.

In accordance with one aspect of the present invention, the electrical characteristics of the substrate in the processing system, as well as the characteristics of the dielectric material associated with the substrate support, are estimated and calculated based upon the shape and qualities of the substrate support dielectric material and also the electrical characteristics associated with each material layer of the substrate being processed.

Further features of the invention and its various advantages are set forth in greater detail below.

BRIEF DESCRIPTION OF THE FIGURES

The accompanying drawings, which are incorporated in and constitute a part of this specification, illustrate embodiments of the invention and, together with a general description of the invention given below, serve to explain the principles of the invention.

DETAILED DESCRIPTION

Figure 1:
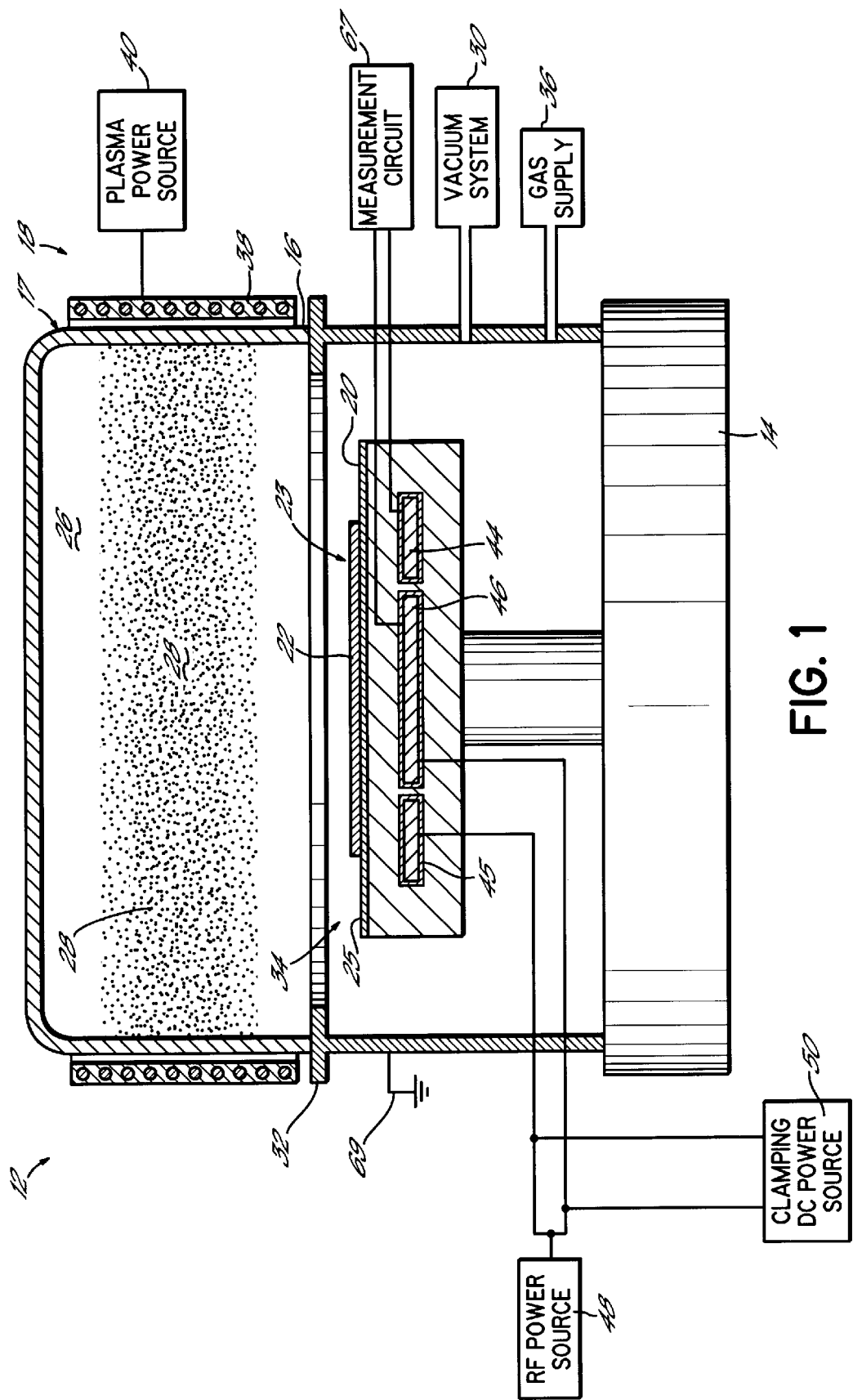
FIG. 1 is a side cross-sectional view of one embodiment of a plasma processing system to be utilized in accordance with the principles of the present invention.

FIG. 1 illustrates one embodiment of a plasma processing system in accordance with the principles of the present invention. The plasma processing system generally comprises a processing chamber 12, including a base section 14 formed of a suitable metal, such as stainless steel, and a dielectric section 16 formed of a suitable material, such as quartz. A plasma-generating assembly 18 is coupled with the dielectric section 16 of the processing chamber 12. A substrate support assembly or susceptor 20 is positioned within the processing chamber 12 and is configured for supporting a semiconductor wafer or substrate 22 thereon for plasma processing. The processing chamber 12, and specifically, the dielectric section 16 defines a process space 26 therein for containing a plasma 28. The substrate 22 is positioned below the process space 26 and plasma 28 in the embodiment of FIG. 1.

In one embodiment of the present invention, the processing system may be a stand-alone plasma processing system which is utilized for an isolated plasma process. In another embodiment, the processing system may be configured to be incorporated into a multi-process system with a plurality of other chambers and processing systems and a centrally located substrate transfer module, not shown, which moves substrates between the various systems. Such multi-chamber, multi-process systems are known in the art.

For plasma processing, process space 26 generally must be under a vacuum. Thus the processing chamber 12 is coupled to an appropriate vacuum system 30 including suitable vacuum pumps and valves, as are known in the art, for providing the desired vacuum pressure within process space 26. The processing chamber 12 would be appropriately configured with the necessary openings for introducing a vacuum into space 26, as is known in the art.

The plasma-generating assembly 18 is shown in FIG. 1 and is electrically coupled to the dielectric section 16 of processing chamber 12. The plasma-generating assembly 18 inductively couples electrical energy into the dielectric section 16, which is often referred to in the art as a "bell jar" enclosure, and thereby forms a plasma 28 in the process space 26 above substrate support assembly 20 (see FIG. 1). The dielectric section or enclosure 16 is seated on a flange 32 of base 14 which surrounds the open top 34 of base 14. Suitable O-ring seals and other seals (not shown) are usually positioned between the base 14 and dielectric section 16 for proper vacuum sealing of the various sections of the processing chamber.

For forming a plasma within space 26, a process gas is introduced into the space 26 and electrical energy is electrically coupled into the space to ionize the gas particles to form a plasma. To that end, the processing chamber is coupled to an appropriate process gas supply 36 which introduces a suitable process gas for forming a plasma 28. Gas supply 36 will also supply whatever other gases are necessary for processing. Any appropriate gas dispersing element (not shown) may be coupled to gas supply 36 for uniformly introducing the process gas, such as Argon, into space 26 for forming a uniform and dense plasma. Gas supply 36 might also contain multiple gases which are mixed together in chamber 12, such as for chemical vapor deposition.

To ignite and sustain a plasma within space 26, the plasma generating assembly includes an inductive element in the form of a helical coil 38 which is wound around dielectric section 16, as illustrated in FIG. 1. The coil 38 is essentially an elongated conductor formed in the shape of a helical coil which is dimensioned to fit around section 16 and against an outer wall surface 17 of the enclosure. Coil 38 is electrically coupled to a plasma power source 40 which will conventionally include an RF power supply and appropriate RF matching circuitry (not shown) for efficient coupling of RF power to the coil 38. RF electrical energy from the power source 40 is inductively coupled into the process space 26 by coil 38 to excite the process gas to form plasma 28. Inductively coupled plasmas and the formation of same are known in the art and various different configurations from the one shown in the drawings may also be utilized for inductively coupling energy into the process space 26. Therefore, FIG. 1 discloses, in a broad conceptual form, only one possible embodiment for inductively coupling a plasma into the processing chamber 12.

Furthermore, it will be readily understood by a person of ordinary skill in the art that a plasma processing system suitable for use in the present invention may take any one of a number of different forms and include differently configured processing chambers. For example, another inductively coupled plasma processing system might utilize a flat coil (as opposed to a helical coil) which is positioned on the top of the processing chamber where energy is coupled through a dielectric window at the top of the chamber. Furthermore, the plasma might be formed capacitively, rather than inductively. In such a capacitively coupled system, an electrode element in the process space 26, such as an electrically biased gas-dispersing showerhead (not shown), is utilized in combination with another electrode, such as a biased substrate support assembly 20 and substrate 22. An electric field between the electrodes sustains a plasma proximate the substrate. Accordingly, the present invention may be incorporated with various different plasma processing systems using inductively coupled plasmas or capacitively coupled plasmas or systems which otherwise form a plasma for processing a semiconductor substrate 22.

In the present invention, multiple electrodes are used to shape a plasma to improve the processing results associated therewith. Referring again to FIG. 1, the embodiment of the invention illustrated therein comprises a plurality of electrodes, including a first electrode 44 coupled to the substrate support 20 and a second electrode 46 also coupled to the substrate support proximate the first electrode 44. The electrodes 44, 46 are shown embedded within the substrate support 20. The second electrode 46 is generally spaced from the first electrode 44 and is electrically isolated therefrom. To that end, the electrodes may be surrounded by dielectric material 45 within support 20, or alternatively, the entire substrate support 20 may be formed of a dielectric material, as noted below.

The present invention anticipates the use of multiple electrodes for creating a DC bias on the substrate surface 23 and selectively varying that DC bias. For varying the bias, the effective bias may be measured in accordance with the invention. The present invention as disclosed covers systems utilizing at least two electrodes, but possibly a greater number of electrodes, and the claims cover such a multiple electrode processing system. For easier reference herein and in describing the invention, the electrodes illustrated in the drawings are sometimes designated as a first electrode 44 and second electrode 46, although as noted, a third, a fourth, and other electrodes might also be utilized in other embodiments of the invention. Furthermore, the first and second electrodes may be alternatively designated. For example, in the embodiments illustrated in FIGS. 1 and 2, the multiple electrodes include an outer ring electrode 44, which is designated as a first electrode, and an inner disk-shaped electrode 46, which is designated the second electrode. However, such designations are for reference only and may be reversed, such that the electrode 44 is designated the second electrode and the electrode 46 is designated the first electrode.

The dielectric material 45, or the material of support 20, used to insulate the electrodes, and any other dielectric material utilized between the substrate 22 and the electrodes 44, 46 will affect the measurement of the RF-induced DC bias on the substrate which is created by the electrodes. As noted above, the high resistivity of the dielectric material yields low DC current in the electrodes which is difficult to measure without an amplification circuit, as noted above. That low current condition is exacerbated by a dielectric material positioned on the top surface of the substrate support 20. For example, to prevent charge damage to a substrate, the upper surface of support 20 might also be coated with a layer of dielectric material 25. The present invention is directed to processing systems which utilize dielectric material between the electrodes and substrate in any of various different configurations. Therefore, the processing system may utilize one or more of the various dielectric elements 45, 25 as illustrated in FIG. 1, or a different configuration.

In accordance with another aspect of the present invention, the DC bias on the electrodes 44, 46 formed by the RF power source 48 is selectively varied between the electrodes. To that end, the bias of one electrode might be selectively varied with respect to a constant bias on the other electrode, or vice versa. Alternatively, the bias of both (or more) electrodes might be selectively varied relative to each other in accordance with the principles of the present invention. Accordingly, the designation of the electrodes as first and second electrodes in the drawings for purposes of illustrating the invention, should not be construed as limiting the invention in any way to only two electrodes, or to particular bias levels on those electrodes.

In one embodiment of the invention, the first and second electrodes 44, 46 are embedded within the substrate support or susceptor 20, as shown. The substrate support 20 may be formed of a dielectric material, such as aluminum nitride. The electrodes may be of a suitable electrically conductive material such as molybdenum. Suitable electrodes, for example 44, 46 are available as 120 micron thick molybdenum electrodes from N.G.K. of Japan. Other suitable electrode materials and dielectric materials may also be utilized in accordance with the principles of the present invention. If the substrate support 20 is formed completely of a dielectric material, the further dielectric layers 45 around the electrode may not be necessary.

Electrodes 44 and 46, as discussed hereinbelow, are electrically coupled to an RF power source which includes an appropriate RF power supply 54 for delivering RF power to the electrodes. In one embodiment of the invention, the electrodes 44, 46 are also utilized to electrostatically clamp substrate 22 to the substrate support 20. To that end, the electrodes 44, 46 are shown in FIG. 2 coupled to a clamping DC power source 50 which induces a DC bias on the electrodes to form a suitable electric field, which clamps substrate 22 in accordance with well-known electrostatic clamping principles.

The RF power source 48 in combination with the electrodes 44, 46 forms an RF-created DC bias on substrate 22 and specifically on an upper surface 23 of the substrate which faces the plasma 28. The DC bias on substrate surface 23 accelerates ions and other charged particles within the plasma 28 to the surface 23. The substrate bias on surface 23 enhances etching in a plasma etch process, or is used to enhance deposition, such as in PECVD, as discussed above. The clamping DC bias formed on a substrate by source 50 is generally confined away from surface 23 and does not significantly affect the RF-created DC substrate bias at surface 23 which interacts with the plasma. While it is known to bias a substrate in such a way for enhancing etching and deposition processes, there has generally been little control over such biasing, and the plasma processes have been left to the vagaries of the plasma 28 formed within the process space 26.

The invention in U.S. patent application Ser. No. 09/565,606, titled "Improved Apparatus and Method for Plasma Processing of a Substrate Utilizing an Electrostatic Chuck," filed on May 4, 2000, and incorporated by reference herein addresses problems in the art by providing selective variation of the RF-created DC bias on the substrate surface through selective biasing of the electrodes 44, 46. The present invention provides a further improvement to such selective biasing by allowing accurate measurement of the particular relative bias created on each of the electrodes so that the bias may be more precisely adjusted for more selective plasma processing.

Figure 2:
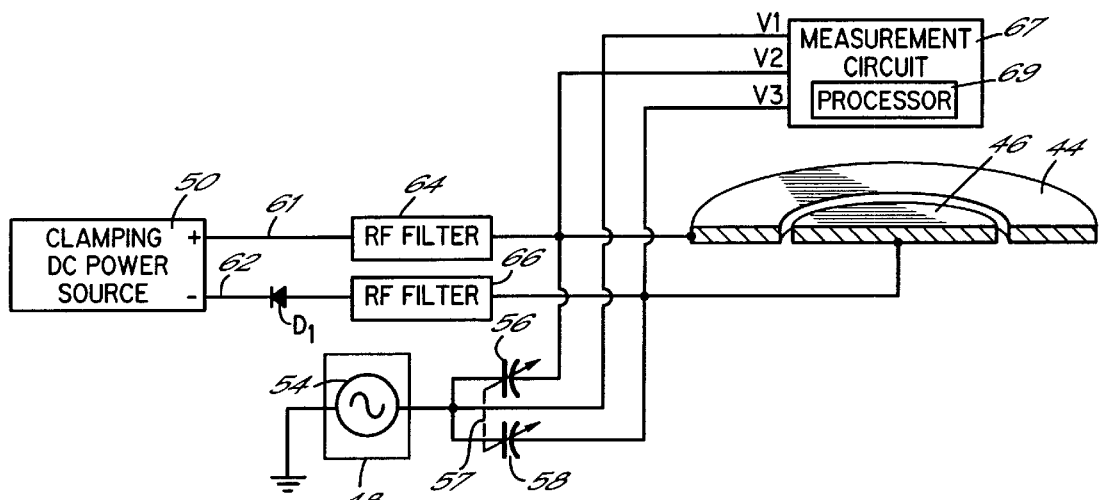
FIG. 2 is a perspective view and circuit schematic view of one embodiment of the present invention.

Turning now to FIG. 2, one embodiment of the invention is illustrated showing a cut-away perspective view of the first and second electrodes 44,46. The first and second electrodes 44, 46 are coupled to the RF power source 48 which includes an RF power supply 54 capable of producing a suitable RF signal to bias the electrodes. In accordance with one aspect of the present invention, electrical capacitors 56, 58 are electrically coupled between the RF power source 48 and the electrodes 44, 46, and one or more of the electrical capacitors 56, 58 has variable or adjustable capacitance characteristics for varying the DC bias created on the substrate surface 23 by at least one of the electrodes relative to the DC bias created on the substrate surface by at least one of the other electrodes. In the embodiment illustrated in FIG. 2, the first electrode 44 is coupled to a first capacitor 56 having a variable capacitance. That is, the capacitance of the capacitor 56 may be adjusted to be increased or decreased. The second electrode 46 is coupled to the RF power source 48 by a second capacitor 58. In the embodiment illustrated in FIG. 2, the second capacitor also has variable capacitance. Suitable capacitors to be used in the present invention are conventional variable capacitors, such as variable air capacitors or variable vacuum capacitors.

As noted above, with respect to the designation of first and second electrodes, the capacitors 56, 58 are similarly designated for the purpose of illustrating the invention. It is contemplated that more than two electrodes might be utilized and, therefore, more than two capacitors, either all being variable, or a combination of variable and fixed capacitors, might be utilized for coupling the various electrodes to the RF power source 48. Accordingly, the indication of capacitors as first and second capacitors herein should not in any way be construed as limiting with respect to the scope of the invention.

In accordance with one aspect of the invention, the variable capacitors 56, 58 are utilized to vary the RF-induced capacitively-coupled DC bias created on the substrate surface 23 by one of the electrodes relative to the DC bias created on the substrate surface by another of the electrodes. In that way, the effect of the plasma on certain portions of the substrate surface 23 may be selectively varied. Specifically, electrical biasing of each of the electrodes relative to each other may be selectively varied by varying the electrical capacitance of the capacitor coupled between a particular electrode and the RF power source 48. For example, one of the electrodes might be biased with a higher bias voltage than the other electrode, depending upon how the plasma is to be affected. As noted above, plasma in a confined space, such as plasma 28 in the processing chamber 12 will generally experience non-uniformities within the plasma density. Particularly, the density is most often greatest in the center of the chamber 12, and therefore, in the center of the substrate, rather than at the outer edges of the substrate. As a result, variations in etch rate, deposition rate, and other plasma-affected parameters may vary radially across the substrate surface 23. The present invention may be used to address such plasma non-uniformities and to address the radial variability of associated plasma parameters, including etch rates and deposition rates.

In one embodiment of the invention, described herein, the electrodes 44, 46 are biased differently relative to each other to address the problem of a greater plasma density in the center of the plasma and substrate surface 23 than at the outer edges of surface 23. As will be readily understood by a person of ordinary skill in the art, various other plasma non-uniformities associated with a particular processing system might also be addressed by the present invention by varying the capacitance of the capacitors and manipulating the RF-induced DC bias on one or more of the electrodes and thus on the substrate surface 23.

In FIG. 2, the first capacitor 56 has a variable capacitance which may be increased or decreased as necessary. In order to address a lower plasma density at the outer edges of a substrate, the first electrode 44 should be biased with a higher bias level so that a greater number of plasma particles are attracted to the outer annular or peripheral edge of the substrate surface 23. Decreasing the capacitance of capacitor 56 will increase the bias level on electrode 44. For example, if both of the electrodes 44, 46 are biased similarly by the RF power source 48, with a power level in the range of 300–400 Watts, both of the electrodes might experience a bias level of approximately −100 Volts DC with reference to ground potential. As such, the electrodes would impose a generally uniform DC bias across surface 23 of the substrate 22 in the range of approximately −100 Volts DC. The uniform DC bias across the substrate surface 23 is then subject to the non-uniformities in the plasma 28. The amount of power delivered to the various electrodes 44, 46 will depend upon the capacitance properties of the respective capacitors 56, 58 coupled between those electrodes and the RF power source 48.

In one aspect of the present invention, by decreasing the capacitance of variable capacitor 56, more power is delivered to the first or outer electrode 44, and thus the electrode 44 will maintain a higher DC bias level at an outer or annular portion of the substrate surface 23. Of course, by increasing the capacitance of the variable capacitor 56, an opposite result occurs, wherein more power is delivered to the second or center electrode 46 relative to the first electrode 44. The electrode 46 is then maintained at a relatively higher bias than electrode 44, thus maintaining a center portion of the substrate surface 23 at a higher bias level than the outer annular portion of surface 23.

Maintaining a higher bias level at the outer, annular portion of the substrate surface 23 is desirable for addressing the reduced plasma density normally occurring at the outer edges of the plasma 28 to achieve a uniform etch or deposition rate radially across the substrate surface 23.

To obtain a somewhat similar effect and to increase the bias level on the outer electrode 44 relative to center electrode 46, the second capacitor 58 might be varied as well. Increasing the effective capacitance of the second capacitor 58 will decrease the amount of power delivered to the electrode 46 and thus decrease the bias level of electrode 46. This effectively increases the bias level proximate the outer, annular portion of substrate surface 23 relative to the bias level at the inner, or center, portion of substrate surface 23. Still further, both electrodes, 56 and 58 might be varied, wherein each of the capacitors 56, 58 are adjusted to increase or decrease their capacitance relative to each other to achieve the desired relative bias level adjustments on the electrodes 44, 46 and across surface 23. For example, raising the relative bias level on the outer or first electrode 44 with respect to electrode 46 may involve decreasing the capacitance of capacitor 56, increasing the capacitance of capacitor 58, or both conditions simultaneously. Referring to FIG. 2, the capacitors 56, 58 might be physically connected together by a linkage 57 for synchronized variation of their capacitances.

The present invention as described herein may be utilized in the plasma processing chamber with or without a substrate support which includes an electrostatic chuck. That is, the substrate support 20 might utilize electrostatic clamping to hold a substrate in place or may use mechanical clamping structures (not shown). Like electrostatic clamping, mechanical clamping is a well-known technique. FIGS. 1 and 2 illustrates components which might be utilized to impose an electrostatic chuck feature on the substrate support utilizing the first and second electrodes 44, 46. Specifically, the clamping DC power source 50 is coupled to the electrodes 44, 46 to provide a DC potential difference between the electrodes and thus electrostatically clamp the substrate to the support 20 in accordance with well-known electrostatic clamping principles. The clamping DC power source would generally include a clamping DC power supply with a positive terminal 61 and a negative terminal 62 coupled to the electrodes. In the embodiment illustrated in FIG. 2, the positive terminal 61 is coupled to the outer or first electrode 44 and the negative terminal 62 is coupled to the inner or second electrode 46. However, the DC clamping bias voltage might be reversed with respect to the electrodes, and the electrostatic chuck would work equally well.

When the present invention is utilized with an electrostatic chuck, RF filters 64, 66 are utilized to protect the clamping DC power source 50 from damage by the RF signal from power supply 54. The capacitors 56, 58 illustrated in the embodiment of FIG. 2 are both variable, and therefore, the capacitance of each may be varied for varying the RF-formed DC bias created on the substrate. When an electrostatic clamping feature is also incorporated with the invention, the capacitors 56, 58 further provide isolation to the RF power supply 54 from the DC signal of power source 50.

As disclosed above, it may be desirable to vary the capacitances of the capacitors 56, 58 simultaneously and in synchronization. To that end, the capacitors could be configured for being adjusted in a synchronized fashion by being coupled together, such as with a linkage 57. For example, it may be desirable to maintain a somewhat constant power load on the RF power supply 54 during processing. Accordingly, the variable capacitors 56, 58 are physically coupled or ganged together such that their capacitance values may be adjusted simultaneously in a synchronized fashion to provide a somewhat constant power load. Specifically, the ganged capacitors might be adjusted such that the capacitance of the first capacitor 56 is decreased while the capacitance of a second capacitor 58 is increased a similar amount to thereby provide a greater bias level on the first or outer electrode 44 relative to the second or inner electrode 46. The capacitors 56, 58 are electrically coupled to power supply 54 in a parallel orientation, and thus their capacitances are added mathematically in series to present an overall capacitive load to the power supply. Therefore, the overall power load presented to power supply 54 by the capacitors will be the cumulative of the sum of the capacitances of capacitors 56, 58. Thus, if one capacitor is increased, the other might be decreased by the same amount to maintain a constant load. As such, by ganging the adjustment mechanisms together for the variable capacitors 56, 58, the relative differential DC bias between the electrodes 44, 46 might be varied and adjusted as discussed above while maintaining a relatively constant power load on the RF power supply.

Turning again to FIG. 2, one embodiment of the present invention is described in further detail. The present invention provides a system and methodology for measuring the DC bias which is capacitively created on each electrode by the RF power source 48. The invention takes into account the low DC current levels achievable with the electrodes due to the dielectric materials therearound, and the resulting difficulty in measuring the electrode bias levels.

Figure 3:
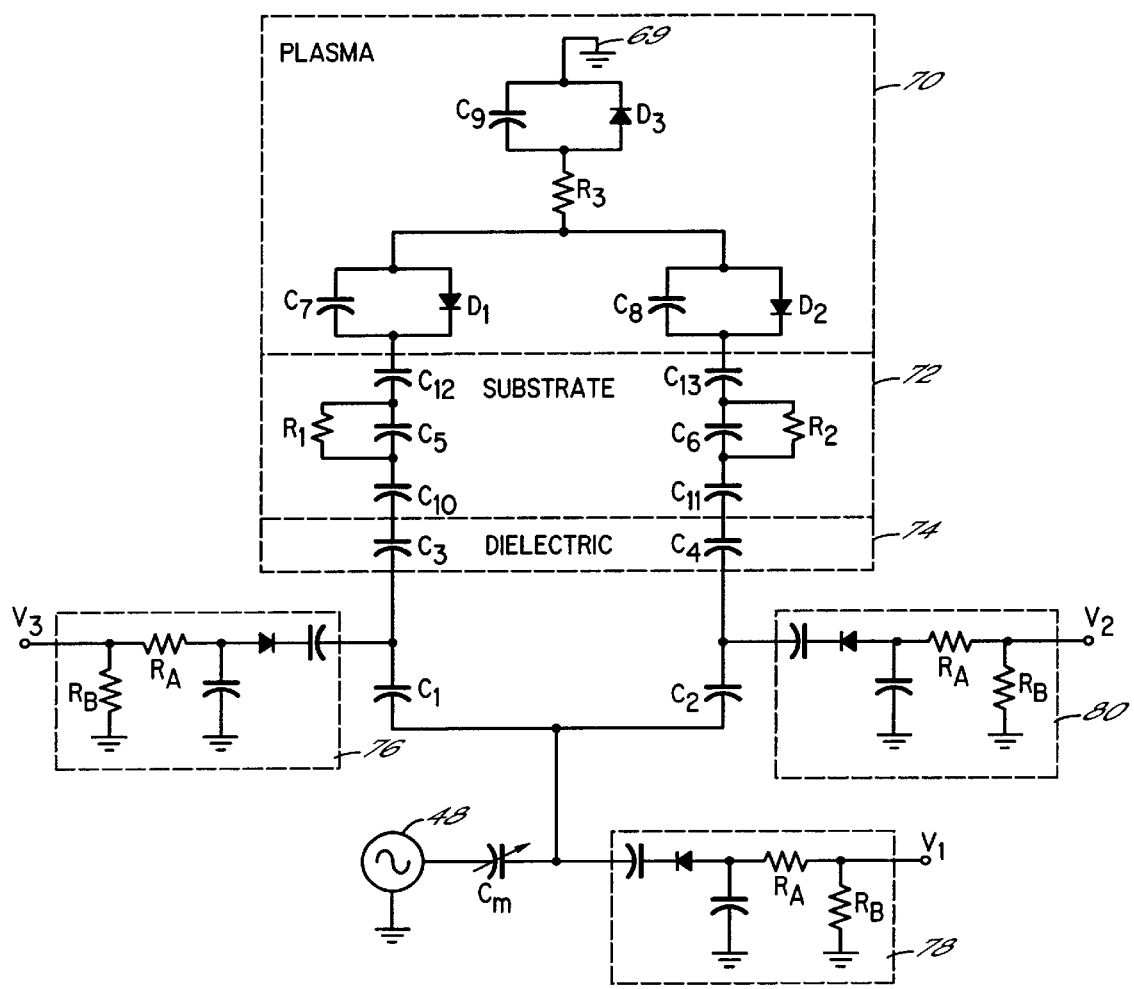
FIG. 3 is a circuit schematic reflecting the assigned electrical characteristics of various components within the processing system of the invention in accordance with principles of the present invention.

FIG. 3 is a current schematic modeling various components and elements of the processing system in accordance with the principles of the present invention. The present invention is directed to an inventive modeling of the processing system with presumed and calculated characteristics for the elements of the system, in combination with a series of measurements associated with the biased electrodes. Based upon those measurements, the DC bias associated with the electrodes is determined. In accordance with one aspect of the present invention, the processing system is analyzed in different sections, including various sub-systems or subsets of elements. Electrical characteristics of the sub-systems are determined and then utilized in determining the overall bias on the electrodes, according to the principles of the invention.

Referring to FIG. 3, the subset of elements indicated collectively by reference numeral 70 provides the inventive model for the electrical characteristics of a plasma. Those elements, indicated collectively by reference numeral 72, model the electrical characteristics of the substrate being processed. The elements indicated collectively by reference numeral 74 model the electrical characteristics of the dielectric materials associated with the substrate support. FIG. 3 is a schematic modeling of a system utilizing two electrodes. Therefore, RF power source 48 is supplied to two separate legs of the circuit, indicated by splitting capacitors C1 and C2. Adjustable capacitor $C_m$ adjusts the level of the RF power supply 48. For other or additional electrodes, other legs may be added to the model of FIG. 3, as appropriate.

The capacitors C1 and C2 reflect the capacitance of the capacitors 56 and 58 discussed with respect to FIG. 2. In accordance with the principles of the present invention, various elements illustrated in the inventive model of FIG. 3 estimate and/or presume the electrical characteristics, including the resistance, capacitance and overall impedance of the individual components in the system. Circuits or sub-circuits illustrated by reference numerals 76, 78 and 80 are voltage measuring circuits, as discussed further hereinbelow, for measuring certain voltages utilized in determining the RF bias associated with an electrode, according to the invention.

Figure 4:
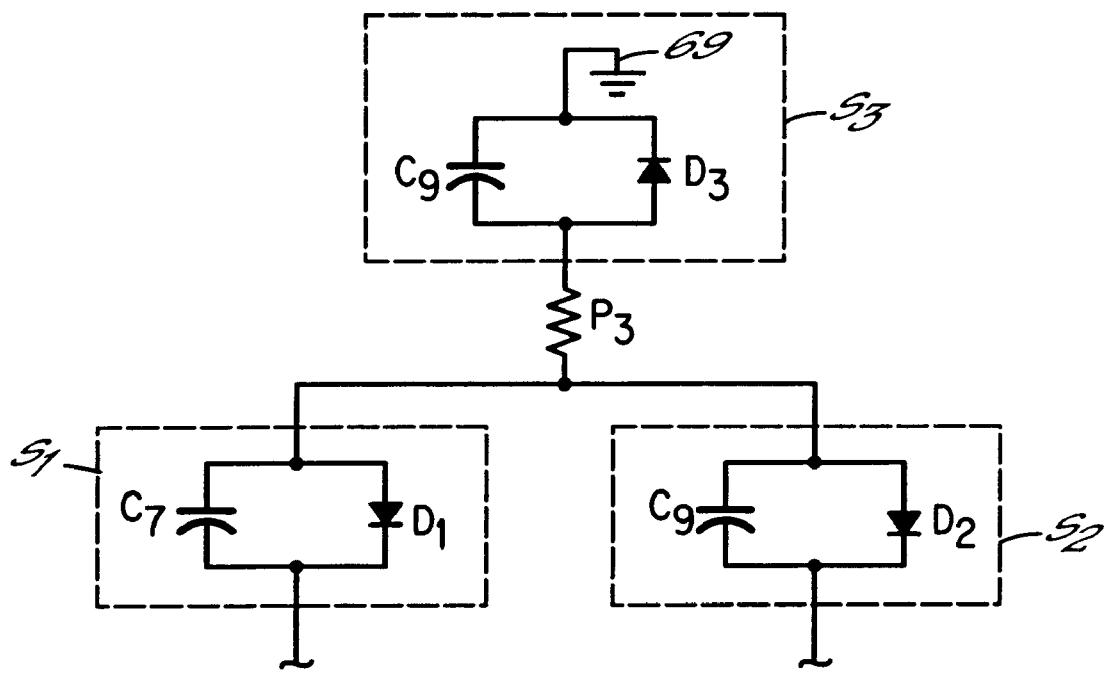
FIG. 4 is a circuit schematic reflecting the electrical characteristics of sub-systems of FIG. 3.

Referring to FIG. 4, the plasma model 70 has subsection $S_3$ which is reflective of the electrical characteristics associated with the plasma sheath proximate to the grounded surfaces of the processing chamber. In the invention, the capacitive and current flow characteristics of the plasma sheath on the grounded chamber surfaces are reflected by capacitor $C_9$ and diode $D_3$. Resistance properties of the plasma are indicated by the resistor $P_3$. Finally, the electrical characteristics for the plasma sheath above the substrate for the two electrodes and two areas associated therewith are illustrated. $S_1$ indicates the modeled electrical characteristics of the plasma sheath above the substrate associated with one electrode, and $S_2$ indicates the modeled electrical characteristics of the plasma sheath above the other of the electrodes. Capacitor $C_7$ and diode $D_1$ indicate the capacitive and current flow characteristics of the plasma sheath associated with $S_1$ and the one electrode, and capacitors $C_8$ and $D_2$ indicate similar electrical characteristics for the sheath associated with $S_2$ and the other electrode.

In accordance with one aspect of the present invention, the resistance of the plasma $R_3$ will generally be small, and thus the inventors have considered it to be small in accordance with the invention. Therefore, in the invention, the plasma resistance effects within the DC bias determination will be assumed to be generally negligible. In another aspect of the invention, the voltage drop across the plasma indicated by $S_3$ is significantly less than the voltage drop associated with $S_1$ and $S_2$. Therefore, in accordance with another aspect of the present invention, most of the voltage drop across the plasma is associated with the sheath above the substrate, and therefore associated with each of the individual electrodes. As such, in FIG. 4, the sheath characteristics of one electrode, or $S_1$ and the sheath characteristics of the other electrode, or $S_2$, will be predominant.

Figure 5:
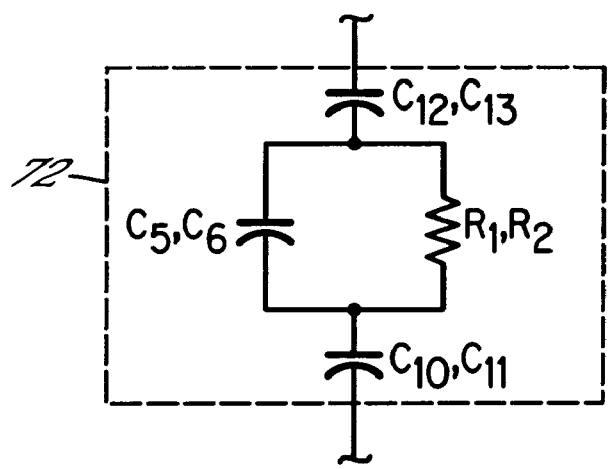
FIG. 5 is a circuit schematic reflective of the electrical characteristics of another sub-system of FIG. 3.

Turning to FIG. 5, the electrical characteristics of the substrate are indicated by reference numeral 72. As illustrated in FIG. 3, each electrode will have a leg of the circuit associated therewith. However, for purposes of illustration, FIG. 5 only illustrates one leg with dual nomenclature.

The capacitance components $C_{12}$ and $C_{13}$ are indicative of the capacitive characteristics of the substrate associated with any dielectric on the surface of the substrate in accordance with one aspect of the invention. Somewhat similarly, the capacitance values $C_{10}$ and $C_{11}$ are indicative of the capacitance characteristics of dielectric material on the bottom surface of the substrate. Finally, the middle portion of the circuit schematic 72 reflects the capacitive and resistive characteristics of the substrate, such as the silicon wafer. The capacitance values $C_5$ and $C_6$ correspond to resistance values $R_1$ and $R_2$ for each of the individual electrodes as set forth in FIG. 3. For each of the electrical elements and components reflective of the inventive circuit schematic and model of FIG. 3, there will be an associated electrical impedance. The voltage drop between the ground reference 69 of the system and the RF level of RF power source 48 is associated with each of the various electrical impedances of the system elements in accordance with the aspects of the present invention.

Referring to FIG. 5, the determination of the DC bias associated with the electrodes utilizes a voltage drop which is attributable to the substrate. The voltage drop across the substrate, in accordance with one embodiment of the invention, is based upon an assumed impedance of the substrate of approximately one Ohm or less. Generally, the inventors have determined that the total impedance for a silicon wafer is less than one Ohm for most thicknesses of dielectric on one or both sides of the wafer, although other presumed impedance values might be used in the invention. Accordingly, the RF voltage drop across the wafer will generally be negligible, in accordance with one aspect of the present invention. Therefore, for one embodiment of the invention, the total impedance of circuit 72 illustrated in FIG. 5 will be considered generally one Ohm or less. Of course, other values might be associated with the substrate within the parameters of the present invention, and attributing an impedance to the substrate of approximately one Ohm or less is only one example of a suitable substrate impedance within the apparatus and method of the present invention.

Referring again to FIG. 3, system 74 indicates that the impedance of the model associated with the electrostatic chuck is primarily due to the capacitance, and therefore capacitive reactance, associated with the dielectric material of the substrate support and/or the dielectric material surrounding the electrodes. The thickness and permittivity of the dielectric which is utilized for the substrate support and/or to surround the electrodes is utilized to calculate a capacitance and therefore determine a capacitive reactance for the dielectric of the substrate support. Such capacitance determinations will be based upon the geometry of the substrate support and its material components. For known dielectric material and shape, the calculation for capacitance is known and is therefore somewhat straightforward to a person of ordinary skill in the art, and therefore the capacitance values $C_3$ and $C_4$ may be calculated.

The capacitances of the splitting capacitors $C_1$ and $C_2$ may be selected as desirable for the system, and the values are therefore utilized in determining the voltage drop across the splitting capacitors and associated with each electrode. In one embodiment of the invention, the two RF splitting capacitors $C_1$ and $C_2$ are chosen such that the impedance provided by each capacitor is in the range of approximately one Ohm.

Sub-systems 76, 78 and 80 are voltage measuring circuits for measuring respectively the voltage across the splitting capacitors $C_1$ and $C_2$, and the voltage provided by the RF power source 48. Essentially the voltage measuring circuits are voltage dividers across resistors $R_A$, $R_B$, including other diode and capacitive elements as illustrated in FIG. 3. Voltage measuring circuit 76 indicated with the output of $V_3$ measures the voltage at a point between the electrode and its respective splitting capacitor $C_1$. In FIG. 3, the respective electrode associated with splitting capacitor $C_1$ is indicated by capacitance $C_3$. Similarly, the voltage measuring circuit 80, with an output of $V_2$, measures the voltage between an electrode and its respective splitting capacitor $C_2$. The other electrode and its electrical properties are indicated by the capacitor $C_4$. Voltage measuring circuit 78, with the output of $V_1$, measures the RF power provided by source 48 to the respective electrodes and their splitting capacitors.

In accordance with the methodology and apparatus of the present invention, the voltage drop across the splitting capacitors $C_1$ and $C_2$ is determined based upon the difference between the $V_1$ measurement and the $V_2$ and $V_3$ measurements for the electrodes. That is, subtracting the voltage measurement in $V_2$ and $V_3$ from the RF power supply voltage $V_1$, the present invention determines the voltage drop across each splitting capacitor. With the capacitance of the splitting capacitors $C_1$ and $C_2$ known, the capacitive reactance, and therefore the impedance, of the splitting capacitors is also known. As a result, the RF currents into the electrode may be obtained based upon the determined voltage drop across each of the splitting capacitors. For a particular electrode, and therefore for each leg of the circuit illustrated in FIG. 3, the RF current in the circuit is generally constant. In accordance with one aspect of the present invention, the voltage measurement circuits 76, 78 and 80 might be incorporated into an overall larger measurement circuit 67, as illustrated in FIG. 2. The measurement circuit 67 includes a processor which is coupled to each of the individual voltage measurement circuits and is operable for determining the voltage drop across each of the splitting capacitors based upon the values of $V_1$, $V_2$, and $V_3$. The processor 69 is operable for calculating the DC bias associated with the electrodes based upon the determined voltage drop.

Once the RF current is determined, as discussed above, the voltage drop across the dielectric of the substrate support, as indicated by reference numeral 74 may be determined. Utilizing the shape or geometry and capacitive properties of the dielectric material of the substrate support, the impedance of that material may be determined. As noted above, knowing the overall shape, thickness, and permittivity of the dielectric material utilized for the substrate support, the capacitance and capacitive reactance may be determined for that dielectric material. Therefore, the impedance may also be determined. Based upon that impedance, and the RF current, the processor determines the voltage drop associated with the dielectric of the substrate support. Knowing that voltage drop and the voltage drop across the splitting capacitors, the voltage drop across the remaining sub-systems of the substrate 72 and the plasma are determined.

As noted above, a suitable impedance may be associated with the substrate for use by the processor in determining the DC bias associated with the electrodes. To that end, the substrate might be considered to essentially have an impedance of approximately one Ohm or less. Therefore, the voltage drop across the substrate may be determined based upon impedance of one Ohm. Alternatively, the voltage drop across a substrate might be considered to be negligible. Subtracting the voltage drop across the splitting capacitors, substrate support dielectric, and substrate from the measured voltage $V_1$, the voltage drop across the plasma may be determined.

The electrodes and respective splitting capacitors are coupled to the RF power source 48 in parallel. Accordingly, each of the legs of the model circuit, FIG. 3, is shown in parallel with the RF power source 48. While the substrate impedance may be given the value of approximately one Ohm or less, the specific capacitive and resistive properties of the substrate and any dielectric material thereon might be utilized and estimated for a more accurate measurement. As illustrated in FIG. 5, the various presumed values of the capacitive and resistive elements illustrated may yield a more precise impedance for the substrate. In any case, the voltage drop across the substrate will generally be small with respect to the voltage drop across the plasma sheath above each of the electrodes.

Turning now to FIG. 4, the capacitive, resistive, and electrical characteristics of the plasma may be estimated as illustrated by the circuit schematic of sub-system 70. Again, the plasma resistance $P_R$ is assumed to be small, and therefore negligible. Although a value may be assigned for the plasma resistance $R_3$ which would be utilized by processor 69. In accordance with another aspect of the present invention, the impedance of a plasma sheath $S_3$ at the various grounded surfaces of the processing chamber is also assumed to be small. That is, it is assumed to be very small with respect to the voltage drop across the sheath across the electrodes, indicated for two electrodes by $S_1$ and $S_2$, such that it is considered negligible. Assuming the voltage drop associated with $S_3$ and $R_3$ to be very small with respect to the voltage drop associated with $S_1$ and $S_2$, the voltage drop across the plasma is assigned primarily to the plasma sheath above the substrate. The voltage drop across the plasma sheath above the substrate is indicative of the bias voltage above each of the electrodes. Therefore, knowing the overall voltage drop and the voltage drop associated with each sub-system, as noted above, the bias voltage associated with each electrode is determined. The bias voltage is provided by the measurement circuit 67 and may be utilized for selectively adjusting the output of the RF power source 48 to provide a desired DC bias voltage. In that way, the effects of the plasma may be selectively adjusted to achieve the desired results.

The present invention provides for measurement of the DC bias from the electrodes of the substrate support without the requirement of a large amount of DC current for that measurement. Therefore, amplification circuits may be avoided and the present invention may be utilized to accurately set the desirable bias for each electrode to thereby selectively influence the plasma. As noted above, a bipolar or two electrode substrate support is utilized for the examples set forth in the Figures and described herein. However, more than two electrodes might be utilized. In such a case, additional voltages would have to be measured, and an additional leg would be added to the circuits of FIGS. 2, 3, and 4 for reflecting the electrical characteristics associated with each additional electrode.

While the present invention has been illustrated by the description of the embodiments thereof, and while the embodiments have been described in considerable detail, it is not the intention of the applicant to restrict or in any way limit the scope of the appended claims to such detail. Additional advantages and modifications will readily appear to those skilled in the art. Therefore, the invention in its broader aspects is not limited to the specific details representative apparatus and method, and illustrative examples shown and described. Accordingly, departures may be made from such details without departure from the spirit or scope of applicant's general inventive concept.

What is claimed is:

1. A processing system for processing a substrate with a plasma comprising:

a processing chamber configured for containing a plasma;

a substrate support within the chamber having a supporting surface for supporting a substrate proximate the plasma;

first and second electrodes coupled to the substrate support, the electrodes each being positioned proximate the supporting surface and being electrically isolated from one another;

an RF power source coupled to each of the electrodes across a respective splitting capacitor for biasing the electrodes, the biased electrodes each developing a DC bias thereon and operable for creating a DC bias on a substrate positioned on the supporting surface;

a first voltage measurement circuit electrically coupled to one of the electrodes at a point between that electrode and its respective splitting capacitor, the first voltage measurement circuit being operable to measure the voltage $V_2$ at said point associated with the one electrode;

a second voltage measurement circuit electrically coupled to the other of the electrodes at a point between that other electrode and its respective splitting capacitor, the second voltage measurement circuit being operable to measure the voltage $V_3$ at said point associated with the other electrode;

a third voltage measurement circuit electrically coupled to the RF power source and being operable to measure the voltage $V_1$ provided for the electrodes from the RF power source;

a processor coupled to said voltage measuring circuits, the processor operable for determining the voltage drop across each of the splitting capacitors for the electrodes based on the difference between the $V_1$ measurement and the $V_2$ and $V_3$ measurements for the electrodes and based on that voltage drop, calculating the DC bias associated with at least one of the electrodes;

wherein the relative RF-created DC bias levels on the first and second electrodes may be monitored so that the DC bias levels for the electrodes may be optimally adjusted.

2. The processing system of claim 1 wherein said controller is operable, based upon the difference in the voltage measurements between the $V_1$ measurement and the $V_2$ and $V_3$ measurements, for determining the electrical current flowing in the splitting capacitors and in the respective electrodes, and using the determined electrical current to calculate a voltage drop attributable to at least one of the substrate support and a substrate supported thereon.

3. The processing system of claim 2 wherein the substrate support includes a dielectric layer thereon, said voltage drop attributable to the substrate support being calculated utilizing the capacitive properties of the dielectric material.

4. The processing system of claim 1 wherein the processor is operable for individually calculating the DC bias associated with each of the electrodes.

5. The processing system of claim 1 wherein the processor calculates the DC bias associated with at least one of the electrodes utilizing a voltage drop attributable to a substrate based on an impedance of the substrate of approximately 1 Ohm or less.

6. The processing system of claim 1 wherein said splitting capacitors have an impedance of approximately 1 Ohm.

7. The processing system of claim 1 wherein the electrodes and respective splitting capacitors are coupled to the RF power source in parallel.

8. A processing system for processing a substrate with a plasma comprising:

a processing chamber configured for containing a plasma;

a substrate support within the chamber having a supporting surface for supporting a substrate proximate the plasma;

a plurality of electrodes coupled to the substrate support, the electrodes being positioned proximate the supporting surface and being electrically isolated from one another;

an RF power source coupled to the electrodes across respective splitting capacitors for biasing the electrodes, the biased electrodes each developing a DC bias thereon and operable for creating a DC bias on a substrate positioned on the supporting surface;

a voltage measurement circuit electrically coupled to at least one of the electrodes at a point between that electrode and its respective splitting capacitor, the first voltage measurement circuit being operable to measure the voltage $V_2$ at said point associated with the one electrode;

a voltage measurement circuit electrically coupled to the RF power source and being operable to measure the voltage $V_1$ provided for the electrodes from the RF power source;

a processor coupled to said voltage measuring circuits, the processor operable for determining the voltage drop across the splitting capacitor for the at least one electrode based on the difference between the $V_1$ measurement and the $V_2$ measurement for the electrode and based on that voltage drop, calculating the DC bias associated with the at least one electrode;

wherein the relative RF-created DC bias levels on an electrode may be monitored so that the DC bias level for the electrode may be optimally adjusted.

9. A method for processing a substrate with a plasma comprising:

positioning a substrate on a supporting surface of a substrate support within a processing chamber;

generating a plasma in the processing chamber proximate the substrate;

biasing, with an RF power source, a plurality of electrodes which are coupled to the substrate support and positioned proximate the supporting surface, each of the biased electrodes developing a DC bias thereon and thereby creating a DC bias on a substrate positioned on the supporting surface;

coupling the RF power source to each of the electrodes across a respective splitting capacitor so that current flows through a respective splitting capacitor when the particular electrode is biased to provide a voltage drop across the capacitor;

making a voltage measurement $V_2$ at a point between at least one biased electrode and its respective splitting capacitor;

making a voltage measurement $V_1$ at the output of the RF power source for determining the voltage provided by the RF power source for biasing the at least one electrode;

determining the voltage drop across the splitting capacitor for the at least one electrode by determining the difference between the $V_1$ measurement and the $V_2$ measurement;

based on that voltage drop, determining the DC bias associated with the at least one electrode;

wherein the relative RF-created DC bias levels on the electrodes may be monitored so that the DC bias levels for the electrodes may be optimally adjusted.

10. The method of claim 9 further comprising determining an electrical current value for current flowing in the splitting capacitor and in the respective electrode based upon the difference in the voltage measurements between the $V_1$ measurement and the $V_2$ measurement; and using the determined current value to determine a voltage drop attributable to at least one of the substrate support and a substrate supported thereon.

11. The method of claim 10 wherein the substrate support includes a dielectric material, the method further comprising determining said voltage drop attributable to the substrate support utilizing the capacitive properties of the dielectric material.

12. The method of claim 11 further comprising determining the thickness, area and permittivity of the dielectric material to determine said capacitive properties of the dielectric material.

13. The method of claim 9 further comprising making a voltage measurement V at points between a plurality of biased electrodes and their respective splitting capacitors for determining the voltage drops across the plurality of splitting capacitors based on the difference between the $V_1$ measurement and the plurality of V measurements;

based on the voltage drops, determining the DC bias associated with each of the plurality of electrodes.

14. The method of claim 9 further comprising determining the DC bias associated with at least one of the electrodes by utilizing a voltage drop attributable to the substrate based on an impedance of the substrate of approximately 1 Ohm or less.

15. The method of claim 9 further comprising utilizing splitting capacitors having an impedance of approximately 1 Ohm.

16. The method of claim 9 wherein the electrodes and respective splitting capacitors are coupled to the RF power source in parallel.

17. The method of claim 9 further comprising treating a voltage drop associated with the plasma in the processing chamber as negligible in determining the DC bias associated with the at least one electrode.

18. The method of claim 9 wherein the processing chamber includes a grounded element interfacing with the plasma therein, the method further comprising treating a voltage drop associated with the grounded element as negligible in determining the DC bias associated with the at least one electrode.

* * * * *